(12) United States Patent
Konrath et al.

(10) Patent No.: US 9,905,655 B2
(45) Date of Patent: Feb. 27, 2018

(54) METHOD FOR REDUCING BIPOLAR DEGRADATION IN AN SIC SEMICONDUCTOR DEVICE AND SEMICONDUCTOR DEVICE

(71) Applicant: Infineon Technologies AG, Neubiberg (DE)

(72) Inventors: Jens Peter Konrath, Villach (AT); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/205,811

(22) Filed: Jul. 8, 2016

(65) Prior Publication Data

US 2017/0012102 A1    Jan. 12, 2017

(30) Foreign Application Priority Data

Jul. 10, 2015 (DE) .................. 10 2015 111 213

(51) Int. Cl.
| | |
|---|---|
| H01L 29/32 | (2006.01) |
| H01L 29/36 | (2006.01) |
| H01L 29/16 | (2006.01) |
| H01L 21/265 | (2006.01) |
| H01L 21/04 | (2006.01) |

(52) U.S. Cl.
CPC ............ *H01L 29/32* (2013.01); *H01L 21/046* (2013.01); *H01L 21/26506* (2013.01); *H01L 29/1608* (2013.01); *H01L 29/36* (2013.01)

(58) Field of Classification Search
None
See application file for complete search history.

(56) References Cited

U.S. PATENT DOCUMENTS

| | | | | |
|---|---|---|---|---|
| 6,043,516 A | * | 3/2000 | Schulze | ............... H01L 21/263 257/107 |
| 6,200,883 B1 | * | 3/2001 | Taylor | ..................... C23C 14/48 257/E21.336 |
| 2003/0154912 A1 | | 8/2003 | Kartal | |
| 2006/0267104 A1 | | 11/2006 | Scholz | |
| 2007/0120181 A1 | | 5/2007 | Ruething | |

(Continued)

FOREIGN PATENT DOCUMENTS

| | | |
|---|---|---|
| DE | 19640311 | 9/1996 |
| DE | 19725150 | 12/1997 |

(Continued)

OTHER PUBLICATIONS

DE 102006002903 A1 Translation.*

(Continued)

*Primary Examiner* — Whitney T Moore
(74) *Attorney, Agent, or Firm* — Baker Botts L.L.P.

(57) ABSTRACT

Disclosed is a method for forming a semiconductor device and a semiconductor device. The method includes:
in a SiC semiconductor body, forming crystal defects in a first semiconductor region by introducing non-doping particles into the semiconductor body; and
forming a second semiconductor region such that there is a pn junction between the first semiconductor region and the second semiconductor region.

36 Claims, 3 Drawing Sheets

(56) References Cited

U.S. PATENT DOCUMENTS

| | | | |
|---|---|---|---|
| 2007/0240633 A1 | 10/2007 | Leonard | |
| 2008/0023801 A1* | 1/2008 | Mauder | H01L 21/263 257/617 |
| 2009/0305486 A1* | 12/2009 | Schulze | C30B 25/18 438/478 |
| 2011/0042791 A1* | 2/2011 | Schulze | H01L 21/263 257/655 |
| 2013/0140431 A1* | 6/2013 | Yves | G01N 21/6408 250/206 |
| 2013/0341674 A1 | 12/2013 | Werber | |

FOREIGN PATENT DOCUMENTS

| | | |
|---|---|---|
| DE | 60205369 | 9/2005 |
| DE | 102006035630 | 2/2008 |
| DE | 102006002903 | 12/2009 |
| DE | 102008027521 | 12/2009 |
| DE | 102014108279 | 12/2014 |

OTHER PUBLICATIONS

Office Action communication of the German Patent and Trademark Office for Appln. Ser. No. 102015111213.2, dated Jun. 1, 2016.
Office Action Communication of the German Patent and Trademark Office for Appln. Ser. No. 102015111213.2; 8 pages including machine translation, dated Sep. 10, 2017.

* cited by examiner

METHOD FOR REDUCING BIPOLAR DEGRADATION IN AN SIC SEMICONDUCTOR DEVICE AND SEMICONDUCTOR DEVICE

CROSS-REFERENCE TO RELATED APPLICATION

This application claims priority to German Application Serial No. 102015111213.2 filed Jul. 10, 2015 and entitled "Method for Reducing Bipolar Degradation in an SIC Semiconductor Device and Semiconductor Device".

This disclosure in general relates to a method for reducing a bipolar degradation in a Silicon Carbide (SiC) semiconductor device, and an SiC semiconductor device.

Offering low switching losses at high voltage blocking capabilities semi-conductor devices made of Silicon Carbide (SiC) are becoming more and more popular in power electronics applications, such as power conversion and drive applications. SiC exists in a plurality of different crystalline forms. Major polytypes of SiC are 4H-SiC, 6H-SiC, and 3C-SiC. SiC of the 4H or 6H polytype is preferred in the production of semiconductor devices.

SiC of the 4H or 6H polytype is thermodynamically metastable. Thus, energy associated with the recombination of electrons and holes in a semiconductor device may cause regions of an SiC crystal of the 4H or 6H polytype to convert into the thermodynamically stable 3C polytype. In particular, this effect may occur at crystal defects in the 4H or 6H polytype crystal, such as basal plane dislocations or stacking faults. A recombination of electrons and holes at such crystal defects may cause a conversion of the 4H or 6H polytype SiC into 3C polytype SiC at those defects and may cause the defect region to expand. A large defect region, however, may degrade the device properties, such as the on-resistance and leakage current. As such degradation is based on a recombination of bipolar charge carriers, that is, electrons and holes, and affects their lifetime, it may be referred to as bipolar degradation.

There is therefore a need to prevent, or at least reduce bipolar degradation in SiC semiconductor devices.

One embodiment relates to a method for forming a semiconductor device. The method includes, in a SiC semiconductor body, forming crystal defects in a first semiconductor region by introducing non-doping particles into the semiconductor body. The method further includes forming a second semiconductor region such that there is a pn junction between the first semiconductor region and the second semiconductor region.

One embodiment relates to a semiconductor device. The semiconductor device includes, in an SiC semiconductor body, a pn junction between a first semiconductor region and a second semiconductor region. The semiconductor device further includes a defect region with crystal defects induced by introducing particles into the semiconductor body in the first semiconductor region.

Examples are explained below with reference to the drawings. The drawings serve to illustrate certain principles, so that only aspects necessary for understanding these principles are illustrated. The drawings are not to scale. In the drawings the same reference characters denote like features.

In the following detailed description, reference is made to the accompanying drawings. The drawings form a part of the description and by way of illustration show specific embodiments of how the invention may be practiced. It is to be understood that the features of the various embodiments described herein may be combined with each other, unless specifically noted otherwise.

Figures 1, 2A, 2B:
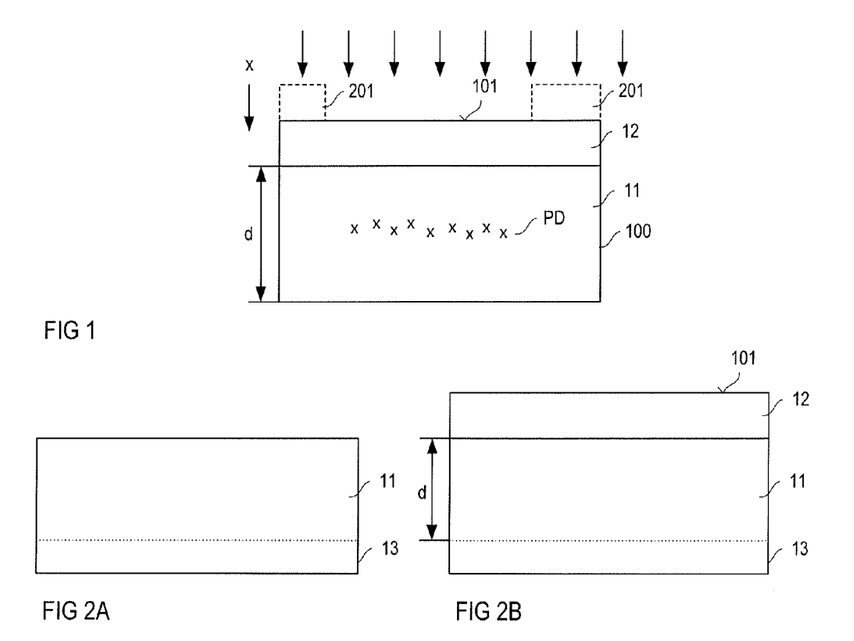
FIG. 1 illustrates one embodiment of a method for producing defects in a SiC semiconductor body that includes a pn junction.
FIGS. 2A-2B illustrate one embodiment of a method for producing the pn junction.

FIG. 1 illustrates one embodiment of a method for producing a silicon carbide (SiC) semiconductor device. FIG. 1 shows a vertical cross sectional view of a semiconductor body 100 of the semiconductor device during one process sequence of the process. The semiconductor device includes a pn junction between a first semiconductor device 11 of a first doping type (conductivity type) and a second semiconductor region 12 of a second doping type (conductivity type) complementary to the first doping type. At least these first and second semiconductor regions 11, 12 of the semiconductor body 100 are comprised of SiC. According to one embodiment, the SiC is SiC of the 4H polytype (4H-SiC) or the 6H polytype (6H-SiC).

The semiconductor body 100 may include defects, such as, for example, basal plane dislocations or stacking faults. In operation of the semiconductor device, that is, when a voltage is applied between the first semiconductor region 11 and the second semiconductor region 12 such that the pn junction is forward biased, electrons and holes may recombine at those defects. The energy associated with such a recombination is dissipated in the semiconductor crystal. In particular in a region where those defects are located, the dissipated energy may cause the SiC crystal to partially convert into 3C-SiC, which is a thermal dynamically more stable SiC polytype than 4H-Sic or 6H-SiC. However, such partial conversion increases the size of one defect region and/or the number of defect regions in the semiconductor crystal. This may result in a degradation such as an increased electrical resistance and enhanced leakage current of those semi-conductor regions, which is highly undesirable.

In order to prevent or at least reduce degradation defects associated with the conversion of 4H-SiC or 6H-SiC into 3C-SiC, the method includes forming crystal defects PD in at least one of the first semiconductor region 11 and the second semiconductor region 12. In the embodiment shown in FIG. 1, those crystal defects PD are produced in the first semiconductor region 11. According to one embodiment, these crystal defects include point defects or complexes with several point defects. Examples of complexes with several point defects include, but are not restricted to, double-voids or complexes with several voids and at least one additional impurity atom such as, for example, nitrogen, oxygen, or vanadium. Those crystal defects may be referred to as zero-dimensional crystal defects, as opposed to one-dimensional or two-dimensional crystal defects such as, for example, stacking faults or basal plane dislocations.

Forming those crystal defects includes implanting non-doping particles via a first surface 101 into the semiconductor body 100. Examples of those non-doping particles implanted into the semiconductor body 100 include protons, noble gas ions, heavy metal ions, and group-IV-ions. "Group-IV-ions" are ions selected from group IV (titanium group) of the periodic system. For example, noble gas ions include helium ions, and heavy metal ions include one of platinum ions, gold ions and vanadium ions.

Forming the point defects in at least one of the first semiconductor region 11 and the second semiconductor region 12 further includes an annealing process to stabilize the defects PD. According to one embodiment, a temperature in the annealing process is selected from a range of between 1100° C. and 1900° C., in particular between 1500° C. and 1800° C.

The defects PD generated in at least one of the first semiconductor region 11 and the second semiconductor region 12 have two effects. First, recombination of charge carriers (electrons and holes) occurs at those defects PD so that less charge carriers recombine at other crystal defects such as, for example, basal plane dislocations or stacking faults. Converting 4H-SiC into 3C-SiC involves an extension of stacking faults or basal plane dislocations on account of energy associated with the recombination of charge carriers at those defects. As the defects PD are zero-dimensional defects they cannot form the basis for an extension of such stacking faults or basal plane dislocations, so that a recombination of charge carriers at those defects PD is not critical when it comes to the extension of stacking faults or basal plane dislocations. Second, those point defects may act as barriers that prevent those other crystal defects (basal plane dislocations, stacking faults) from expanding in the semiconductor body 100.

According to one embodiment, the crystal defects are formed such that the first semiconductor region 11 includes a region where a defect concentration is between 1E16 cm$^{-3}$ and 1E21 cm$^{-3}$, in particular between 1E17 cm$^{-3}$ and 1E20 cm$^{-3}$. This region will be referred to as defect region in the following. In a direction perpendicular to the pn junction, which corresponds to a direction x perpendicular to the first surface 101 in the embodiment shown in FIG. 1, the first semiconductor region 11 has a length d. According to one embodiment, a dimension in the direction x of the defect region is at least 10% of the length d. In a direction perpendicular to the direction x, the dimension of the defect region may be dependent of how the defect region is generated. Examples are explained below.

According to one embodiment, the defect region is spaced apart from the pn-junction. According to one embodiment, a distance between the pn-junction and this region is at least 50% of d (0.5d), at least 66% of d (0.66d), or even at least 75% of d (0.75d). According to one embodiment, the defects are generated such that a maximum of the defect concentration is spaced apart from the pn-junction at least 50% of d (0.5d), at least 66% of d (0.66d), or even at least 75% of d (0.75d).

Different methods may be used to form the pn junction between the first semiconductor region 11 and the second semiconductor region 12. According to one embodiment, shown in FIGS. 2A-2B, the method includes providing the first semi-conductor region 11 (see, FIG. 2A) and epitaxially growing a semiconductor layer forming the second semi-conductor region 12 on the first semiconductor region 11 (see, FIG. 2B). Providing the first semiconductor region 11 may include epitaxially growing a semiconductor layer forming the first semiconductor region 11 on a substrate 13 (shown in dotted lines in FIGS. 2A and 2B).

Figure 3A:
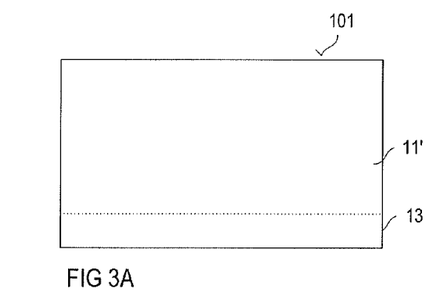
FIGS. 3A-3B illustrate another embodiment of a method for producing the pn junction.
Figure 3B:
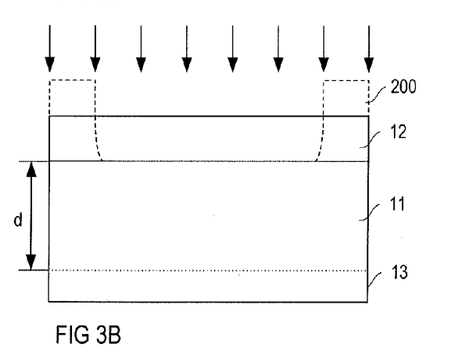

According to another embodiment, shown in FIGS. 3A-3B, the method includes providing a semiconductor layer 11' (see, FIG. 3A), and introducing dopant atoms via a first surface 101 into this semiconductor layer 11'. If the dopant atoms are implanted, as schematically illustrated in FIG. 3B, the method further includes an annealing process in which the implanted dopant atoms are electrically activated. Implanting the dopant atoms optionally includes using an implantation mask 200 that covers certain sections of the first surface 101, and leaves uncovered only those sections into which dopant atoms are to be implanted. Introducing the dopant atoms may including implanting the dopant atoms, whereas several implantation steps at several different implantation energies may be applied in order to obtain a desired doping profile in the doped semiconductor layer 11'. Providing the semiconductor layer 11' shown in FIG. 3A may include an epitaxial process in which the layer 11' is grown in a semiconductor substrate 13 (shown in dotted lines in FIGS. 3A and 3B).

According to another embodiment, the first region 11 shown in FIG. 2A is a semiconductor substrate on which the second semiconductor region 12 is formed in an epitaxial process. Equivalently, the layer 11' shown in FIG. 3A can be a semiconductor substrate into which dopant atoms forming the second semiconductor regions 12 are implanted.

According to one embodiment, the first semiconductor region 11 is a semiconductor region of an n-type, and the second semiconductor region 12 is a semi-conductor region of a p-type. For example, the doping concentration of the first semi-conductor region 11 is selected from a range of between 1E14 cm$^{-3}$ and 5E16 cm$^{-3}$, and the doping concentration of the second semiconductor region 12 is selected from a range of between 1E17 cm$^{-3}$ and 1E20 cm$^{-3}$.

The point defects PD can be produced before or after forming the pn junction in the semiconductor body 100. For example, in the method shown in FIGS. 2A-2B, the defects PD may be produced in the first semiconductor region 11 before or after forming the second semiconductor region 12. In the method according to FIGS. 3A-3B the defects PD may be produced in the semiconductor layer 11' before or after forming the second semiconductor region 12. According to yet another embodiment, the defects PD are formed in the first region 11 after a section of the first region 11 has been formed in an epitaxial process and before the first region 11 is completed by a further epitaxial process.

Referring to the explanation above, different types of non-doping particles can be used to produce the point defects PD in the semiconductor body 100. According to one embodiment, the defects PD in the semiconductor body 100 are produced using particles of only one of these types. According to another embodiment, different types of particles are used to form the point defects in the semiconductor body 100.

Figure 4:
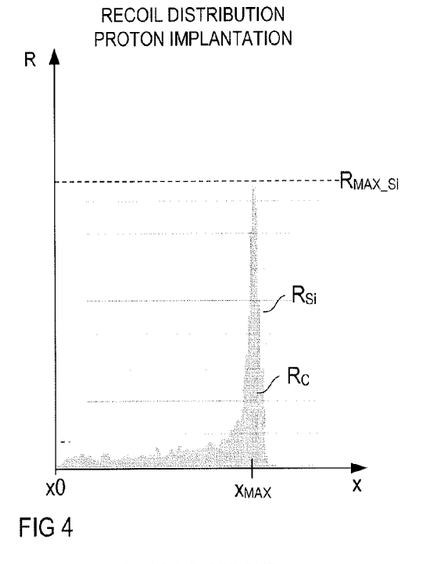
FIG. 4 shows a graph that illustrates a recoil distribution when implanting protons into an SiC semiconductor body.
Figure 5:
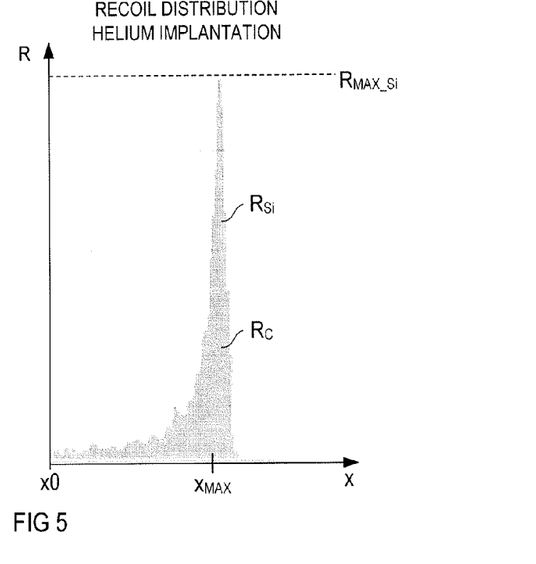
FIG. 5 shows a graph that illustrates a recoil distribution when implanting helium ions into an SiC semiconductor body.
Figure 6:
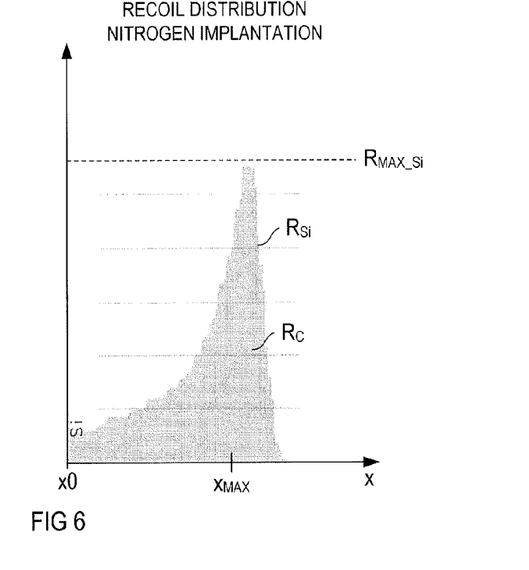
FIG. 6 shows a graph that illustrates a recoil distribution when implanting nitrogen ions into an SiC semiconductor body.

FIGS. 4-6 illustrate the recoil distribution of different types of particles when implanted into an SiC semiconductor body. The recoil distribution illustrates the number of collisions of one implanted particle with silicon atoms and carbon atoms in the semiconductor body at different depths x of the semiconductor body. In FIGS. 4-6, Rs, denotes the number of collisions with silicon atoms and $R_C$ denotes the number of collisions with carbon atoms in the SiC crystal lattice. $R_{MAX\_Si}$ is the maximum number of collisions with silicon atoms.

In FIGS. 4-6, x is the distance between the surface into which the particle are implanted and the position in the semiconductor body in which the collision occurs; x0 denotes the position of the surface and $X_{MAX}$ denotes the position at which the maximum number of collisions occur. FIG. 4 shows the recoil distribution of implanted protons, FIG. 5 shows the recoil distribution of implanted helium ions, and FIG. 6 shows the recoil distribution of implanted nitrogen ions. As can be seen from FIGS. 4-6, the recoil distributions are different in view of the maximum number of collisions with silicon atoms ($R_{MAX\_Si}$) and carbon atoms, and also different in view of the distribution of those collisions between the surface (denoted by x0 in FIGS. 4-6) and the position $x_{MAX}$ where most of the collisions occur. In case of protons and helium ions, the collisions are mainly concentrated in the region of $x_{MAX}$, while in the case of boron and nitrogen ions a significant number of collisions occur between the surface at x0 and $x_{MAX}$. For example, if the particles are implanted with an implantation energy of 1 MeV, the position $x_{MAX}$ where most collisions occur and the number $R_{MAX\_Si}$ of collisions with silicon atoms is as follows:

Protons: $x_{MAX}$=10.8 micrometers, $R_{MAX\_Si}$=15E4
Helium ions: $X_{MAX}$=2.3 micrometers, $R_{MAX\_Si}$=35E5
Nitrogen ions: $X_{MAX}$=0.95 micrometers, $R_{MAX\_Si}$=20E6

The distribution of defects obtained in the semiconductor body when implanting particles of the type explained with reference to FIGS. 4-6 is similar the recoil distribution. In particular, at a given implantation energy, the position in the semiconductor 100 where the defect distribution has its maximum substantially corresponds to the position $x_{MAX}$ shown in FIGS. 4-6. As can be seen from FIGS. 4-6 the defect distribution in the semiconductor body 100 can be adjusted by suitably selecting the type of particles and the implantation energy, whereas increasing the implantation energy does not significantly change the shape of the recoil distribution, but shifts the position $x_{MAX}$, where the maximum of the recoil distribution occurs, deeper into the semiconductor body. According to one embodiment particles of one type at different implantation energies are implanted. According to another embodiment different types of particles are implanted.

Figure 7:
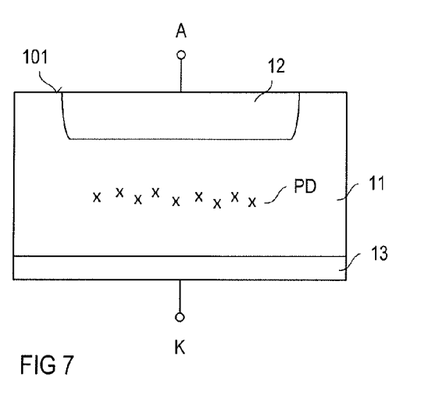
FIG. 7 shows a vertical cross sectional view of a diode.

FIG. 7 shows a vertical cross sectional view of a diode implemented with a semiconductor structure shown in FIG. 1. In this diode, the first semiconductor region 11 forms a base region and the second semiconductor region 12 forms a first emitter region 12 of the diode. Furthermore, the diode includes a second emitter region 13 of the same doping type as the bas region 11. This second emitter region 13 may be formed by implanting dopant atoms via one surface into the semiconductor body 100, and by activating the dopant atoms in an annealing process. Alternatively, the second emitter region 13 is formed by a semiconductor substrate on which the first semiconductor region 11 is formed in an epitaxial process, as explained with reference to FIGS. 2A-2B and 3A-3B. A doping concentration of the second emitter region 13 may be in the same range as the doping concentration of the first emitter region 12 explained above. That is, the doping concentration of the second emitter region may be selected from a range of between 1E17 cm$^{-3}$ and 1E20 cm$^{-3}$. In the diode shown in FIG. 7, the first emitter region 12 forms or is connected to an anode A, and the second emitter region 13 forms or is connected to a cathode K.

Figure 8:
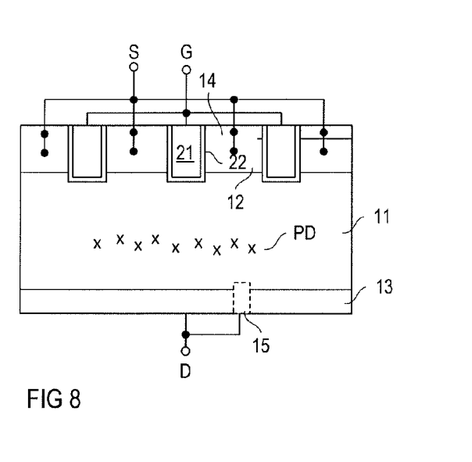
FIG. 8 shows a vertical cross sectional view of an MOS transistor.

FIG. 8 shows a vertical cross sectional view of a transistor implemented with a semiconductor structure shown in FIG. 1. In this transistor, the first semiconductor region 11 forms a drift region and the second semiconductor region 12 forms a body region. Furthermore, the transistor includes a source region 14 adjoining the body region and a drain region 13, whereas the drift region 11 is arranged between the drain region 13 and the body region 12. The drain region 13 may be formed using one of the methods explained with reference to FIG. 7 for forming the second emitter region 13. Forming the source region 14 may include implanting dopant atoms into the body region 13 and activating the implanted dopant atoms. Alternatively, forming the source region 14 may include epitaxially growing a semiconductor layer on the body region 13.

Referring to FIG. 8, the transistor further includes a gate electrode 21 adjacent the body region 13 and dielectrically insulated from the body region 13 by a gate dielectric 22. Referring to FIG. 8, the gate electrode may include several gate electrode sections connected to a gate node. In the embodiment shown in FIG. 8, the gate electrode sections are arranged in trenches extending from the source region 14 through the body region 15 into the drift region 11. This however, is only an example. The gate electrode can also be implemented as a planar electrode above a surface of the semiconductor body 100.

Referring to FIG. 8, the source regions 14 and the body regions 12 are connected to a source node S, and the drain region 13 is connected to a drain node. Those connections are only schematically illustrated in FIG. 8. In the MOSFET shown in FIG. 8, the pn junction between the body region 12 and the drift region 11 forms the so-called body diode of the transistor. The doping concentration of the body region 12 and drain region 13 can be selected from the same range explained with reference to the first emitter region 12 and the second emitter region 13 herein above. The doping concentration of the drift region 11 can be selected from the same range explained with reference to the base region herein above.

The transistor shown in FIG. 8 can be implemented as an n-type transistor or as a p-type transistor. In an n-type transistor, the source region 12 and the drift region 11 are n-type semiconductor regions while the body region 12 is a p-type semiconductor region. In a p-type transistor, the source region 12 and the drift region 11 are p-type semiconductor regions while the body region 12 is an n-type semiconductor region. Furthermore, the transistor can be implemented as a MOSFET or an IGBT. In a MOSFET, the drain region 13 has the same doping type as the source region 14. In an IGBT, the doping type of the drain region 13 is complementary to the doping type of the source region 14. An IGBT can be implemented as a reverse conducting (RC) IGBT. In this case, there may be one or more semiconductor regions 15 of a doping type complementary to the doping type of the drain region 13, electrically coupled to the drain node D and extending through the drain region 13 into the drift region 11.

The structure shown in FIG. 1 with the pn junction between the first semiconductor region 11 and the second semiconductor region 12 and the defects generated at least in the first semiconductor region 11 is not restricted to be implemented in a diode as shown in FIG. 7, or a MOSFET or IGBT as shown in FIG. 8, but may be implemented in any semiconductor device that includes a pn-junction which, in certain operation modes of the device, is forward biased. Examples of other semiconductor devices where the structure may be implemented include, but are not restricted to, thyristors, bipolar junction transistors (BJTs), junction field-effect transistors (JFETs), etc.

Figure 9:
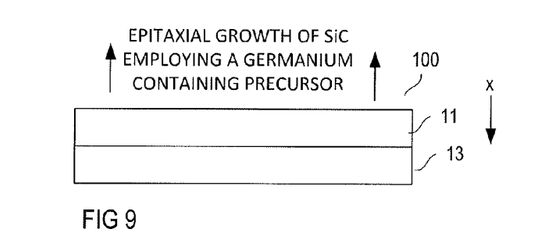
FIG. 9 illustrates a method that includes epitaxially growing SiC in the presence of germanium (Ge)

FIG. 9 illustrates another embodiment of a method which generates the first semiconductor region 11 and crystal defects in the first semiconductor region 11. In this method, the first semiconductor region 11 includes an epitaxial layer grown on a semiconductor substrate. In this epitaxial process, a Germanium (Ge) containing precursor is added to the silicon and carbon containing precursors, so as to incorporate Germanium into the SiC crystal lattice. Examples of the Ge containing precursor include, but are not restricted to, $GeCl_4$, $GeCl_3H$, $GeCl_2H_2$, $GeH_4$, and DiMAGeCl (dimethylaminogermaniumtrichloride). The latter, additionally to Ge, incorporates carbon (C). For example, the carbon containing precursor is propane, and the silicon containing precursor is silane.

In the first semiconductor region 11 produced in this way, germanium atoms are incorporated in the SiC crystal lattice instead of silicon atoms at some positions. As Germanium atoms are larger than silicon atoms, the incorporation of Germanium atoms into the crystal lattice causes strain in the SiC crystal lattice. Furthermore, each of the Germanium atoms acts as a point defect. This is by virtue of the Germanium atoms being larger than silicon atoms. Those crystal defects formed by the incorporation of Ge into the SiC crystal lattice reduce the tendency for one- or two-dimensional crystal defects such as basal plane dislocations and stacking faults to expand.

The concentration of Ge atoms in the SiC crystal lattice and the distribution of the Ge atoms can be adjusted by adjusting the parameters in the epitaxial process. According to one embodiment, the first semiconductor region 11 is formed to have a Ge concentration that is selected from a range of between $1E17$ cm$^{-3}$ and $1E20$ cm$^{-3}$. According to one embodiment, within the first semiconductor region 11, the Ge concentration varies in the direction in which the epitaxial layer is grown, that is, in the vertical direction of the semiconductor body 100. This can be obtained by varying the amount of the Ge containing precursor over the epitaxial process. According to one embodiment, the first semiconductor region 11 is formed such that a first Ge concentration is in the first semiconductor region 11 close to an interface with the substrate and that the GE concentration decreases towards the pn junction (not shown in FIG. 9). In particular, the first semiconductor region may be formed such that the Ge concentration decreases substantially continuously or stepwise from the first concentration at the interface to a second concentration at a position closer to the pn junction than the interface. According to one embodiment, the first and second concentrations are selected from the range mentioned above. According to one embodiment, the position with the second Ge concentration is spaced apart from the pn junction and the first semiconductor region 11 includes a section adjacent the pn junction with substantially no Ge.

Figure 10:
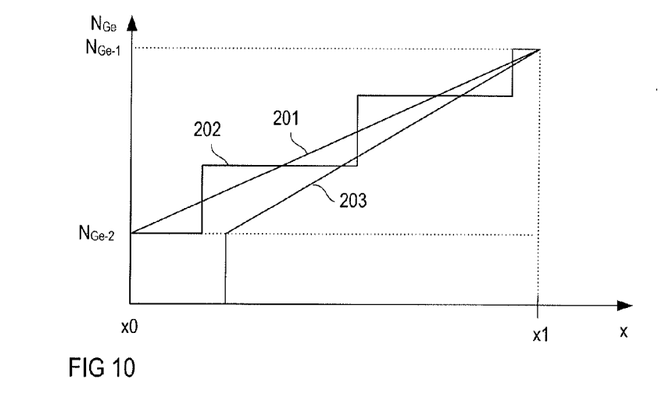
FIG. 10 schematically shows Germanium concentrations in an epitaxially grown semiconductor region, according to three embodiments.

FIG. 10 schematically illustrates three different Ge doping scenarios. In particular, FIG. 10 shows the Ge concentration in the first semiconductor region in the vertical direction of the semiconductor body 100. This vertical direction corresponds to the direction x shown in FIGS. 1 and 9. In FIG. 10, x0 denotes the position of the pn junction in the finished device, and x1 denotes the position of the interface between the first semiconductor region 11 and the substrate 13.

In FIG. 10, curve 201 illustrates a scenario where the Ge concentration decreases continuously towards the pn junction (position x0), curve 202 illustrates a scenario where the Ge concentration decreases stepwise towards the pn junction (position x0), and curve 203 illustrates a scenario where the Ge concentration adjacent the pn junction (position x0) is substantially zero. $N_{Ge-MAX}$ denotes the first concentration, and $N_{Ge-MIN}$ denotes the second concentration in FIG. 10.

On or in the first region 11 formed in this method, a second region forming a pn junction with the first region 11 may be formed in accordance with one of the methods explained with reference to FIGS. 2B and 3B.

Instead of introducing Ge atoms into the semiconductor body during epitaxial crystal growth Ge atoms may be implanted into the semiconductor body in a method as explained with reference to FIG. 1. In this method, Ge atoms replace Si atoms in the SiC crystal lattice, whereas the replaced Si atoms remain as interstitials in the crystal lattice. Those interstitials, additionally to the Ge atoms act as point defects.

In a semiconductor device with a pn-junction as explained before, the defects PD formed by implanting non-doping particles or by incorporating Ge atoms during crystal growth the defects may cause an increase in a forward voltage of the pn junction, which is the voltage to be applied to the pn-junction in order to drive a predefined current through the pn junction. However, these defects provide for a long-term stability of the forward voltage as they prevent one- or two-dimensional crystal defects from expanding.

The invention claimed is:

1. A method for forming a semiconductor device, comprising:
   in a SIC semiconductor body, forming crystal defects in a first semiconductor region by introducing non-doping particles into the semiconductor body;
   forming a second semiconductor region such that there is a pn-junction between the first semiconductor region and the second semiconductor regions; and
   wherein the semiconductor device is selected from the, group consisting of:
      a bipolar diode comprising a base region as the semiconductor region, and an emitter region as the second semiconductor region; and
      an MOS transistor device comprising a drift region as the first semiconductor region, and a body region as the second semiconductor region.

2. The method of claim 1, wherein the crystal defects comprise at least one of point defects and complexes with several point defects.

3. The method of claim 2,
   wherein the first semiconductor region comprises a length in a direction facing away from the pn-junction, and
   wherein forming the defect region comprises forming the defect region such that a shortest distance between the pn-junction and the defect region is at least 50% of the length.

4. The method of claim 2,
   wherein the first semiconductor region comprises a length in a direction facing away from the pn-junction, and
   wherein forming the defect region comprises forming the defect region such that a dimension of the defect region in the direction facing away from the pn-junction is at least 10% of the length.

5. The method of claim 1, wherein forming the crystal defects comprises forming the crystal defects such that there is a defect region in the first semiconductor region, wherein a concentration of crystal defects in the defect region is between $1E16$ cm$^{-3}$ and $1E21$ cm$^{-3}$.

6. The method of claim 1, wherein introducing the non-doping particles comprises implanting the non-doping particles via a first surface into the semiconductor body.

7. The method of claim 6, wherein the particles include at least one type of particles that are selected from a group consisting of:
protons;
noble gas ions;
group-IV ions; and
heavy metal ions.

8. The method of claim 7, wherein the noble gas ions comprise helium ions.

9. The method of claim 7, wherein the heavy metal ions are selected from the group consisting of:
platinum ions;
gold ions; and
vanadium ions.

10. The method of claim 6, wherein implanting the non-doping particles via the first surface into the semiconductor body comprises implanting the particles at least at two different implantation energies.

11. The method of claim 1, wherein introducing the non-doping particles comprises introducing the particles during epitaxially growing the first semiconductor region.

12. The method of claim 11, wherein the non-doping particles comprise Germanium atoms.

13. The method of claim 1, wherein the semiconductor body comprises SiC of one of the 4H and 6H polytype.

14. The method of claim 1,
wherein the first semiconductor region comprises a length in a direction facing away from the pn-junction,
wherein forming the crystal defects comprises forming a maximum of a crystal defect concentration in the first semiconductor region, and
wherein forming the maximum comprises forming the maximum such that a shortest distance between the pn-junction and a position of the maximum is at least 50% of the length.

15. The method of claim 14, wherein forming the maximum comprises forming the maximum such that a shortest distance between the pn-junction and a position of the maximum is at least 66% of the length or at least 75% of the length.

16. The method of claim 1, wherein forming the crystal defects comprises forming a defect region in the first semiconductor region where a minority charge carrier lifetime is less than 1 microsecond.

17. A semiconductor device, comprising:
in an SiC semiconductor body, a pn-junction between a first semiconductor region and a second semiconductor region;
crystal defects in the first semiconductor region induced by introducing particles into the semiconductor body; and
wherein the semiconductor device is selected from the group consisting of:
a bipolar diode comprising a base region as the first semiconductor region, and an emitter region as the second semiconductor region; and
an MOS transistor device comprising a drift region as the first semiconductor region, and a body region as the second semiconductor region.

18. The semiconductor device of claim 17, wherein the crystal defects comprise at least one of point defects and complexes with several point defects.

19. The semiconductor device of claim 17, comprising a defect region that comprises the crystal defects, wherein a concentration of the crystal defects in the defect region is between $1E16\ cm^{-3}$ and $1E21\ cm^{-3}$.

20. The semiconductor device of claim 19,
wherein the first semiconductor region comprises a length in a direction facing away from the pn-junction, and
wherein a shortest distance between the pn-junction and the defect region is at least 50% of the length.

21. The semiconductor device of claim 17, wherein the crystal defects are induced by implanting the non-doping particles via a first surface into the semiconductor body.

22. The semiconductor device of claim 21, wherein the non-doping particles include at least one type of particles that are selected from a group consisting of:
protons;
noble gas ions;
group-IV ions; and
heavy metal ions.

23. The semiconductor device of claim 22, wherein the noble gas ions comprise helium ions.

24. The semiconductor device of claim 22, wherein the heavy metal ions are selected from the group consisting of:
platinum ions;
gold ions; and
vanadium ions.

25. The semiconductor device of claim 17, wherein the crystal defects are induced by introducing the particles during epitaxially growing the first semiconductor region.

26. The semiconductor device of claim 25, wherein the non-doping particles comprise Germanium atoms.

27. The semiconductor device of claim 17,
wherein the first semiconductor region comprises a length in a direction facing away from the pn-junction,
wherein there is a maximum of a crystal defect concentration in the first semiconductor region, and
wherein a shortest distance between the pn-junction and a position of the maximum is at least 50% of the length.

28. The semiconductor device of claim 27, wherein a shortest distance between the pn junction and a position of the maximum is at least 66% of the length or at least 75% of the length.

29. The semiconductor device of claim 17,
wherein the first semiconductor region comprises a length in a direction facing away from the pn-junction, and
wherein a dimension of the defect region in the direction facing away from the pn-junction is at least 10% of the length.

30. The semiconductor device of claim 17, wherein, in the defect region in the first semiconductor region, a minority charge carrier lifetime is less than 1 microsecond.

31. The semiconductor device of claim 17, wherein the semiconductor device is a bipolar diode comprising a base region as the first semiconductor region, and an emitter region as the second semiconductor region.

32. The semiconductor device of claim 31, further comprising a second emitter region of the same doping type as the base region and adjoining the base region.

33. The semiconductor device of claim 17, wherein the semiconductor device is an MOS transistor device comprising a drift rigion as the first semiconductor region, and a body region as the second semiconductor region.

34. The semiconductor device of claim 33, further comprising:
a drain region; and
a gate electrode adjacent the body region and dielectrically insulated from the body region by a gate dielectric.

35. The semiconductor device of claim 33, wherein the MOS transistor is one of a MOSFET and an IGBT.

36. The semiconductor device of claim 17, wherein the semiconductor body comprises SiC of one of the 4H and 6H polytype.

* * * * *

UNITED STATES PATENT AND TRADEMARK OFFICE
CERTIFICATE OF CORRECTION

PATENT NO. : 9,905,655 B2
APPLICATION NO. : 15/205811
DATED : February 27, 2018
INVENTOR(S) : Jens Peter Konrath et al.

Page 1 of 1

It is certified that error appears in the above-identified patent and that said Letters Patent is hereby corrected as shown below:

In the Claims

In Column 8, Line 29, Claim 1, delete "SIC" and insert --SiC--.

In Column 8, Line 34, Claim 1, delete "regions" and insert --region--.

In Column 8, Line 35-36, Claim 1, delete "from the, group" and insert --from the group--.

In Column 8, Line 37-38, Claim 1, delete "the semiconductor region," and insert --the first semiconductor region,--.

In Column 10, Line 37, Claim 28, delete "pn junction" and insert --pn-junction--.

In Column 10, Line 58, Claim 33, delete "rigion" and insert --region--.

Signed and Sealed this
Twenty-ninth Day of May, 2018

Andrei Iancu
*Director of the United States Patent and Trademark Office*